United States Patent [19]

Tibbetts et al.

[11] 4,430,520
[45] Feb. 7, 1984

[54] TRANSDUCER SHIELDING ENCLOSURE

[75] Inventors: George C. Tibbetts; Joseph A. Sawyer, both of Camden, Me.

[73] Assignee: Tibbetts Industries, Inc., Camden, Me.

[21] Appl. No.: 366,332

[22] Filed: Apr. 7, 1982

[51] Int. Cl.³ .......................... H04R 1/02; H05K 9/00
[52] U.S. Cl. .............................. 174/35 R; 174/52 R; 174/65 R; 179/114 A; 336/84 C
[58] Field of Search ............... 174/35 R, 50, 52 R, 174/52 PE, 65 R; 179/114 A, 117, 119 A; 336/84 C

[56] References Cited

U.S. PATENT DOCUMENTS

| 2,927,977 | 3/1960 | Knauert | 179/114 A X |
| 3,239,595 | 3/1966 | Reese et al. | 174/52 PE |
| 3,560,667 | 2/1971 | Carlson | 179/114 A |
| 3,935,398 | 1/1976 | Carlson et al. | 179/119 A X |

Primary Examiner—A. C. Prescott
Assistant Examiner—D. A. Tone
Attorney, Agent, or Firm—Kenway & Jenney

[57] ABSTRACT

A shielding enclosure for a magnetic flux producing device comprises inner and outer casings with closely fitting side walls. One or more leads extending from within the enclosure are laid down during assembly in a clearance slot or groove formed between the casing side walls, and thereafter threaded back out of the clearance slot or groove and extended through a closed aperture in the outer casing for terminal attachment.

10 Claims, 7 Drawing Figures

TRANSDUCER SHIELDING ENCLOSURE

RELATED APPLICATION

An embodiment of a transducer shielding enclosure according to this invention is shown in the drawings of copending U.S. pat. application Ser. No. 328,857, filed Dec. 9, 1981, by one of the present inventors.

SUMMARY OF THE INVENTION

This invention relates generally to devices that produce magnetic fields, and more particularly to magnetic shielding enclosures for such devices to confine such fields.

In certain applications for devices that produce magnetic fields, it is desirable to confine the fields or at least to reduce the leakage thereof into the surroundings of such devices. An illustrative case is that of a hearing aid or similar device that incorporates an electroacoustic transducer having an armature moving in a fluctuating magnetic field, as described in the above-mentioned pending application. In such hearing aids it is common practice to employ an electroacoustic transducer that incorporates magnetic shielding in its design to reduce the leakage, into the environment surrounding the transducer, of the fluctuating magnetic fields generated internally within the transducer. Such fields may be generated as a result of electrical signal current flowing in a coil and/or acoustic pressures operating on a diaphragm of the transducer. The reason for the shielding is that the transducer comprises the output device of an amplifier which, at least in certain modes of operation, is connected to a magnetic transducer input device. It will be recognized that in such devices a feedback loop may be created which is linked by the leakage fields from the output transducer. Such a feedback loop may cause oscillation of the hearing aid system.

The foregoing problem is partially alleviated by the use of microphones that do not operate on magnetic principles. However, most contemporary hearing aids have a magnetic input device for the amplifier in the form of a telephone pickup coil. This coil is used to detect leakage fields from the magnetic receiver of a telephone handset. The telephone pickup coil is commonly mounted in close proximity to the electroacoustic transducer, which greatly accentuates the importance of adequate magnetic shielding of the transducer.

It is common practice to provide a cup-like enclosure of high permeability magnetic material in electroacoustic transducers for use in hearing aids. The shielding property of such enclosure is a function of the effective thickness of its walls, the extent to which the internal magnetic transducer is fully enclosed by the walls, and the reluctance of seams in the walls that carry leakage flux. A further important consideration is the desirability of providing for one or more electrical leads that extend from within the enclosure to the exterior thereof for terminal attachment. It is often desirable to bring leads to a terminal board that is mounted on a wall of the casing enclosure which has the smallest dimension. In an enclosure of rectangular form with inner and outer cup-like casings slip fitted together, the smallest dimension typically corresponds to the height of the overlapping casing side walls. When the terminal board is so located, it is possible to minimize volume waste and to avoid increasing the overall thickness of the transducer (its smallest dimension). With this arrangement, the leads may pass through apertures in a side wall of the inner casing and an aligned slot in a wall of the outer casing. The slot may be open to the edge of the outer casing side wall to prevent interference with the leads as the casings are slip fitted together. However, with such open slot in the outer casing it is difficult to achieve and maintain a close fit between the side walls of the casings because the side walls of the outer casing tend to flare outwardly. This has the adverse effect of increasing the magnetic reluctance of the joint between the walls of the two casing members.

It is a principal object of this invention to provide an improvement in the magnetic shielding properties of enclosures formed of inner and outer casings fitted together with overlapping side walls. In general, this can be accomplished when the cup-like casings fit together with minimal clearance and maximum area of overlap between the respective side walls of the casings.

A second and related object is to provide an improvement in such enclosures whereby the side walls of the outer casing are capable of sustaining an appreciable "hoop stress", that is, a tensile stress developed annularly at the edge or skirt formed by the outer casing side walls, this stress maintaining them in closely fitted relationship with the corresponding side walls of the inner casing.

With the foregoing and other objects hereinafter appearing in view, a feature of this invention resides in the formation of a clearance slot or groove between the side walls of the casings in which the leads are laid down as the casings are slipped together. Typically, after the casings have been fitted in their final assembled positions, the leads are threaded back out of the clearance slot or groove to extend through a closed aperture in the outer casing for subsequent terminal attachment.

A second feature of the invention resides in the provision of a strap in the side wall of the outer casing that partially defines the aperture therein and sustains any appreciable hoop stress developed in the skirt of the outer casing.

Other features of the invention will be more readily understood by reference to the following description of a preferred embodiment and certain variations thereof, as illustrated in the drawings.

DETAILED DESCRIPTION

Figure 1:
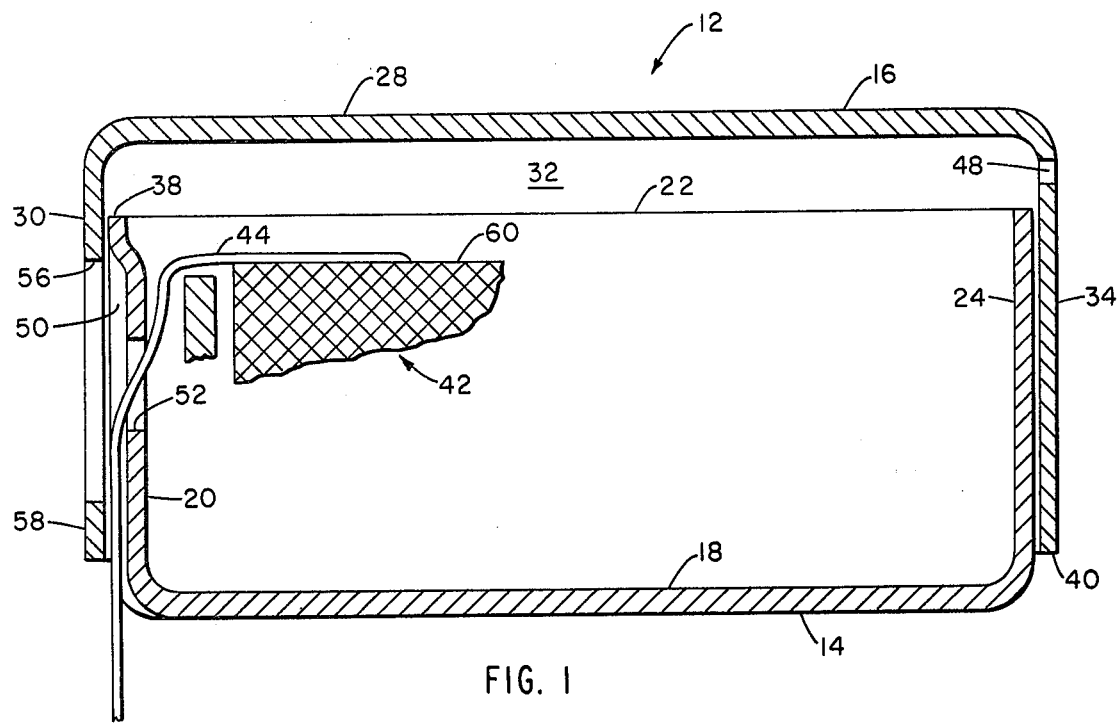
Fig. 1 is a side elevation in section of a first and presently preferred embodiment of the enclosure according to this invention, shown after a first step of assembly.
Figure 2:
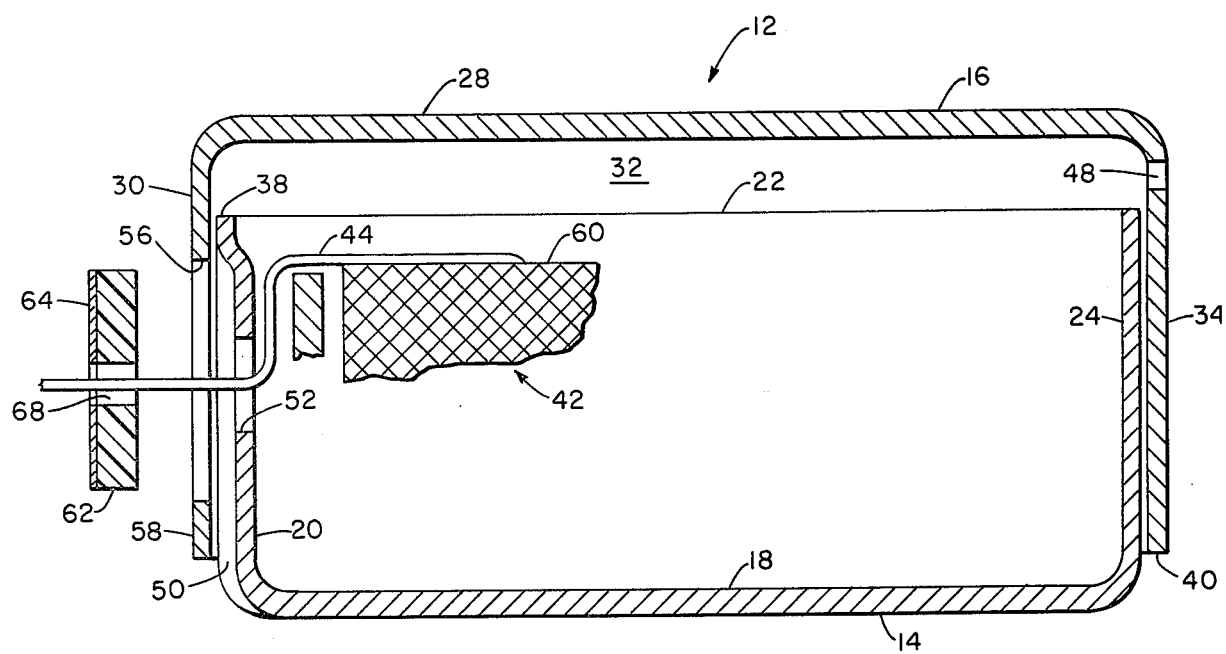
FIG. 2 is a side elevation in section of the embodiment of FIG. 1, shown after a second step of assembly.
Figure 3:
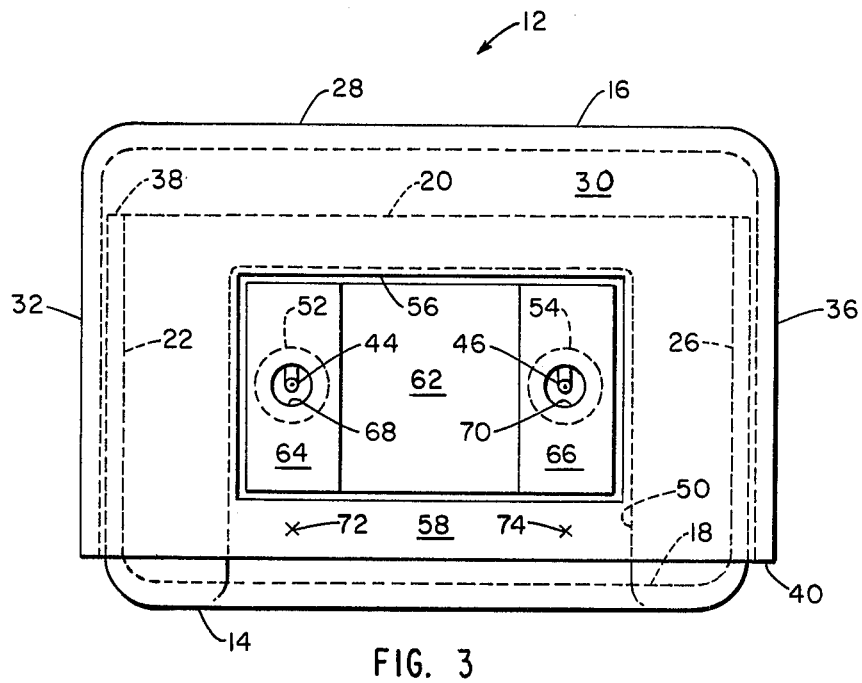
FIG. 3 is an end elevation of the embodiment of FIGS. 1 and 2, shown after a third step of assembly.
Figure 4:
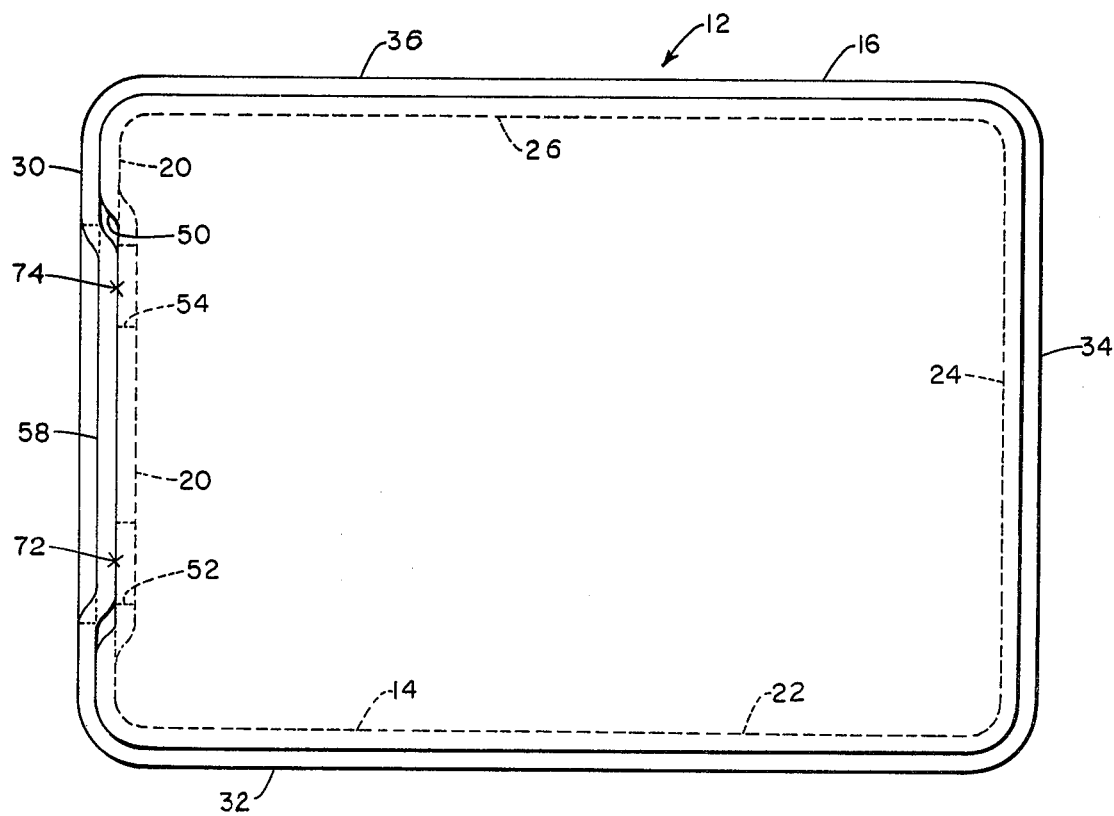
FIG. 4 is a bottom plan view corresponding to FIG. 3.

FIGS. 1 to 4 show a presently preferred embodiment of the invention. This is a shielding enclosure, designated generally at 12, for incorporation in an electroacoustic transducer such as may be used in a hearing aid. The enclosure comprises a cup-like inner casing 14 and a cup-like outer casing 16. Each of the casings is fabricated by drawing from a sheet of magnetic material capable of high permeability. The inner casing is formed with a preferably flat rectangular first or bottom wall 18 and four side walls 20, 22, 24 and 26 integral with and substantially normal to the wall 18. The outer casing is formed with a first or top wall 28 and four side walls 30, 32, 34 and 36 integral with and substantially normal to the wall 28. The side walls of the inner casing extend to an annular skirt having an edge 38. Likewise, the side walls of the outer casing extend to an annular skirt having an edge 40. The casings are each formed so that the inner casing has the closest practicable slip fit within the outer casing along all of their respective side walls except for the walls 20 and 30 as described below. The height of the side walls of the outer casing 16 is chosen to provide the maximum practicable overlap area between contiguous side walls of the respective casings, while preserving in the composite enclosure 12 the natural external radii at the edges and corners of the drawn inner casing 14 where its side walls join the bottom wall 18.

When fully assembled the casings house a magnetic transducer, designated generally at 42, having skeined leads 44 and 46 extending therefrom. The transducer may be like that shown in the above-mentioned pending application, for example. In use, the transducer produces fluctuating magnetic fields that result from electrical current in the leads 44 and 46 and/or from acoustic pressure coupled to the enclosure 12 by an aperture 48 blanked in the outer casing 16. A suitable tubular adaptor (not shown) may be secured to the exterior of the casing 16 over the aperture 48 to extend the acoustic coupling.

In the fabrication of the inner casing 14, a clearance slot or groove 50 is formed during the drawing of the casing, the slot being positioned inwardly of the wall 20. The slot extends at least to the skirt edge 40 of the outer casing and to an extremity in spaced relation to the edge 38 of the inner casing, whereby the skirt of the inner casing has a region with minimal clearance to the side wall 30 of the outer casing.

Further steps in fabricating the casings comprise the blanking of the aperture 48 in the outer casing, circular apertures 52 and 54 in the side wall 20 of the inner casing and within the area of the slot or groove 50, and a rectangular closed aperture 56 in the wall 30 of the outer casing. The closed aperture 56 is partly bounded by a strap 58 that extends to the edge 40 of the skirt of the outer casing. This strap has sufficient width to sustain hoop stress that may be developed in the side walls of the outer casing at the skirt.

The leads 44 and 46 are preferably integral with the winding of a coil 60 forming part of the transducer 42, and are twisted, bonded structures having substantial strength, toughness, flexibility and fatigue resistance. The slot 50 is formed to provide adequate clearance so that the leads may be laid down between the casing walls 20 and 30 as the casings are slipped together.

After the foregoing steps of fabrication, each of the casings is subjected to a high temperature annealing process to develop the desired magnetic properties.

In assembly, the transducer 42 is first secured in the inner casing 14 with the leads 44 and 46 inserted through the apertures 52 and 54, respectively. With the leads laid down within the clearance slot or groove 50, the outer casing is slipped over the inner casing to its final position as shown in FIG. 1.

Next, the leads 44 and 46 are grasped with a suitable tool through the aperture 56, and readily threaded back out of the space between the wall 20 and the strap 58, to extend outwardly through the aperture 56. A terminal board is provided, which comprises an electrical insulating member 62 with copper facings 64 and 66 laminated to it. The terminal board has holes 68 and 70 through which the leads 44 and 46 are threaded, respectively. The terminal board is then inserted in the aperture 56 and adhesive bonded to the wall 20 of the inner casing in a suitable manner. Subsequently the leads are soldered to the respective facings 64 and 66.

The assembly may be considered complete after the lastmentioned step. However, the presently preferred arrangement includes additional steps which are taken after the assembly of the outer casing over the inner casing, and after the leads 44 and 46 have been threaded back to extend through the aperture 56, but before the assembly of the terminal board with the leads. The first additional step is to form the strap 58 into the clearance slot 50 against the wall 20, as illustrated most clearly in FIG. 4. The resulting increase in the arc length of the strap 58 tightens the skirt of the outer casing onto the side walls of the inner casing. The fit between the side walls of the casings is thus considerably improved. To stabilize the tightened fit resulting from the forming of the strap 58 into the slot 50, the strap 58 may be welded to the end wall 20 at locations 72 and 74, as by resistance welding.

Figure 5:
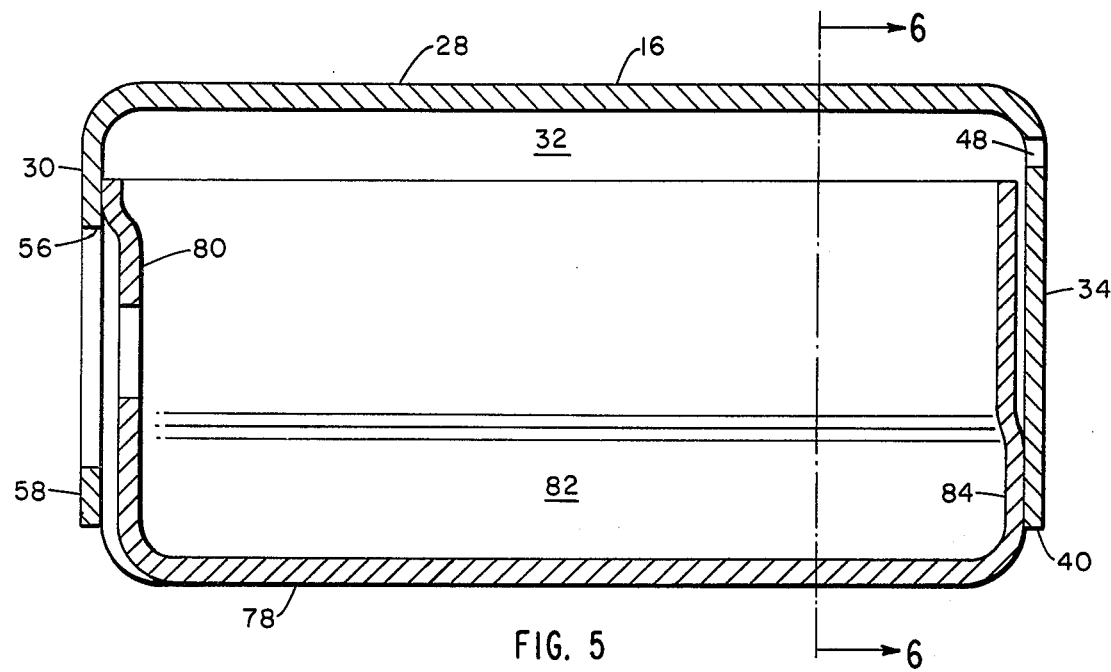
FIG. 5 is a side elevation in section of a second embodiment.
Figure 6:
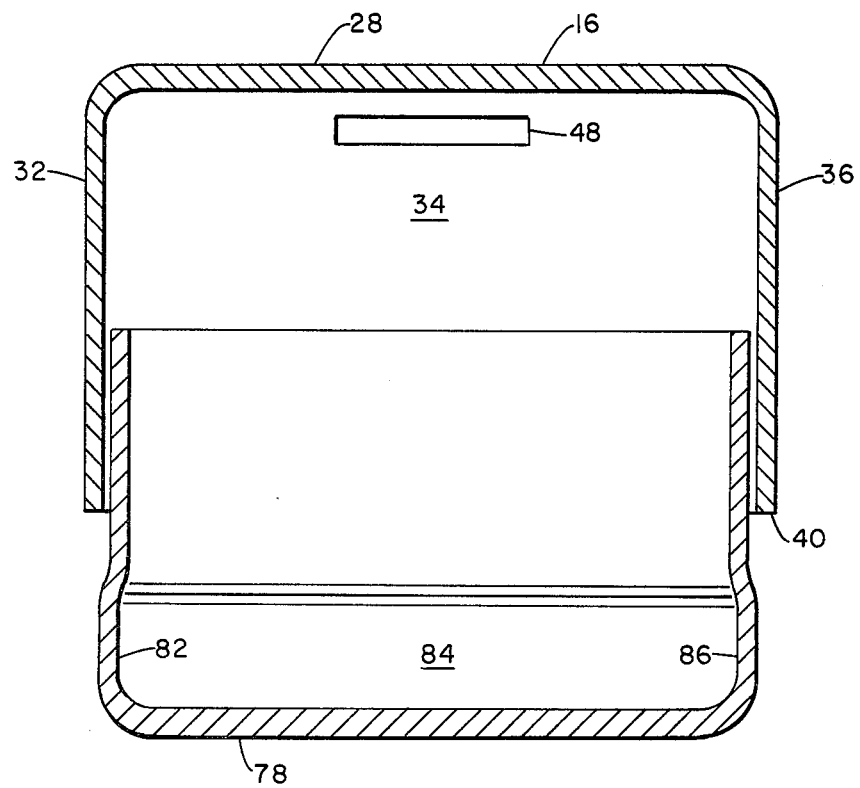
FIG. 6 is a front elevation in section taken on line 6—6 of the embodiment of FIG. 5 at an earlier stage of assembly.

FIGS. 5 and 6 show a second embodiment of the invention comprising the outer casing 16 and an inner casing 78. This embodiment is identical with that of FIGS. 1 to 4, except for a secondary forming operation on the inner casing after it is drawn, in which at least one, but preferably three side walls 82, 84 and 86 are bulged outwardly as shown. The bulges are located adjacent the skirt edge 40 of the outer casing when assembled, and their purpose is to cause an interference fit between the casings upon completion of the assembly. In this variation, the portions of the walls of the inner casing other than the outwardly bulged portions have a slip fit with the outer casing, as in the embodiment of FIGS. 1 to 4. The interference fit requires forceful closing of the casing pair, which results in a greatly reduced effective clearance between the side walls of the two casings. Correspondingly, the magnetic reluctance of the joint between the casings is substantially reduced. It will be noted that the strap 58 is essential to this embodiment, in view of the substantial hoop stress that is developed by the interference fit.

Figure 7:
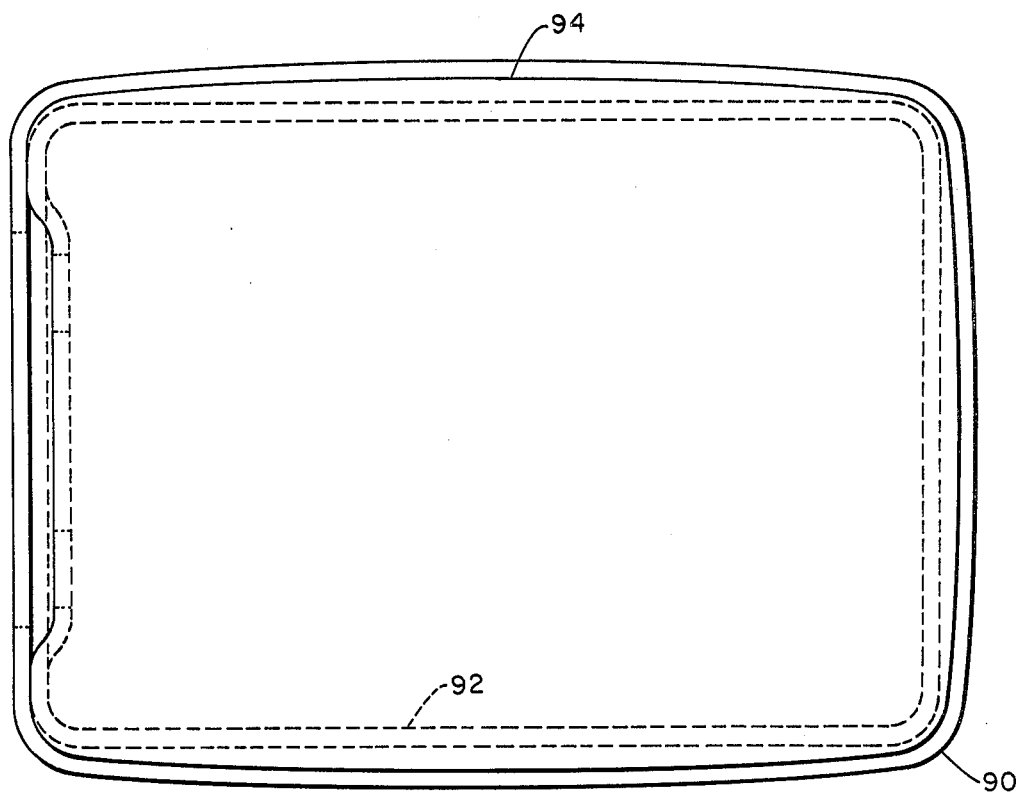
FIG. 7 is a bottom plan view of a third embodiment of the invention.

FIG. 7 illustrates in bottom plan view a third embodiment of the invention, which is a variation of the embodiment of FIGS. 5 and 6. This embodiment includes an outer casing 90 and an inner casing 92 which are like the casings 16 and 78 except that the outer surfaces of the bulges, corresponding to the bulges in the walls 82, 84 and 86 of FIGS. 5 and 6, are arched outwardly in their mid-regions as at 94, instead of being rectangular in plan. The bulges are then definitely convex, so that the hoop stress resulting from the interference fit is able to bring the side walls of the outer casing into greater intimacy of contact with the bulges, helping to compensate for imperfections in the side walls of the outer casing or for curvatures that tend to arise from bending effects in these side walls when the interference is effected.

In all of the above-described embodiments, the strap 58, being an integral portion of the end wall 30 of the outer casing and bounded by its skirt edge 40, maintains the continuity of the skirt. In this way the mechanical precision with which the outer casing is drawn is essentially preserved. If the strap 58 were omitted so that the aperture 56 would comprise a deep notch in the wall 30, the skirt 40 would tend to flare outwardly and virtually all precision of the outer casing dimensions would be lost in the region of overlap with the inner casing.

We claim:

1. The combination of
 a magnetic device having at least one electrical lead and means to produce magnetic flux in response to a current in said lead, and
 a magnetic shielding enclosure substantially surrounding said device and comprising fitted inner and outer casings of high permeability magnetic material, each casing comprising a first wall and side walls each integral with and extending from said first wall to an unbroken annular skirt edge, a number of said side walls of each casing having major areas closely fitting with corresponding side walls of the other casing, a side wall of one of said casings having a portion formed away from a corresponding side wall of the other casing and being adapted to provide a clearance space therebetween for said lead extending to the skirt edge of the outer casing, the side wall of the outer casing having a closed aperture located to permit said lead to be threaded out from said clearance space and extended through said aperture.

2. The combination according to claim 1, in which said formed portion comprises a portion of a side wall of the inner casing formed inwardly thereof.

3. The combination according to claim 2, in which the formed portion is spaced from the skirt edge of the inner casing and the inner casing has a perforation located within the area of said formed portion to permit the lead to extend therethrough into said clearance space.

4. The combination according to claim 1, in which said formed portion comprises a portion of a side wall of the inner casing formed inwardly thereof and the outer casing has a strap bounded by said aperture and the skirt edge of the outer casing, said strap being deformed inwardly into said formed portion.

5. The combination according to claim 1, with a terminal board having a perforation receiving said lead extending through said aperture, said terminal board being secured to said shielding enclosure.

6. The combination according to claim 5, in which the terminal board is inserted in said aperture and secured to a side wall of the inner casing.

7. The combination according to claim 1, in which at least one of the side walls of the inner casing is deformed outwardly, prior to fitting the casings together, to provide an interference fit with the outer casing.

8. The combination according to claim 7, in which the outer casing has a strap bounded by said aperture and the skirt edge of the outer casing and adapted to sustain the hoop stress therein developed by said interference fit.

9. The combination according to claim 8, in which said formed portion comprises a portion of a side wall of the inner casing formed inwardly thereof and the strap is substantially straight.

10. The combination according to claim 7, in which said deformation is arched outwardly in a region between the ends of said side wall.

* * * * *